United States Patent [19]

Coppens et al.

[11] Patent Number: 5,196,290

[45] Date of Patent: Mar. 23, 1993

[54] METHOD FOR MAKING A LITHOGRAPHIC ALUMINIUM OFFSET PRINTING PLATE BY THE SILVER SALT DIFFUSION TRANSFER PROCESS

[75] Inventors: Paul J. Coppens, Turnhout; Ludovicus H. Vefvloet, Kessel; Eric M. Hoes, Herentals, all of Belgium

[73] Assignee: AGFA-Gevaert, N.V., Mortsel, Belgium

[21] Appl. No.: 888,488

[22] Filed: May 27, 1992

[30] Foreign Application Priority Data

Jun. 20, 1991 [BE] Belgium .................. EP 91201578.1

[51] Int. Cl.$^5$ .............................................. G03C 5/54
[52] U.S. Cl. .................................. 430/204; 430/244; 430/248; 430/432; 430/463; 430/227; 430/231
[58] Field of Search .............. 430/204, 244, 248, 432, 430/454, 463

[56] References Cited

U.S. PATENT DOCUMENTS

| | | | |
|---|---|---|---|
| 3,436,217 | 4/1969 | Kleist et al. | 430/248 |
| 3,989,521 | 11/1976 | De Haes et al. | 430/204 |
| 5,068,165 | 11/1991 | Coppens et al. | 430/204 |

*Primary Examiner*—Richard L. Schilling
*Attorney, Agent, or Firm*—Breiner & Breiner

[57] ABSTRACT

The present invention provides a method for making a lithographic aluminium offset printing plate comprising the steps of:

information-wise exposing an imaging element comprising on an aluminium support a layer of physical development nuclei and a silver halide emulsion layer developing said information-wise exposed imaging element in the presence of a silver halide solvent to obtain a silver image in said layer of physical development nuclei and removing all layers on top of said silver image to expose said silver image by means of washing with rinsing water characterized in that said rinsing water has a pH of 4 to 8 and is bufferred.

8 Claims, No Drawings

METHOD FOR MAKING A LITHOGRAPHIC ALUMINIUM OFFSET PRINTING PLATE BY THE SILVER SALT DIFFUSION TRANSFER PROCESS

DESCRIPTION

1. Field of the Invention

The present invention relates to a method for producing a lithographic aluminium offset printing plate by the silver complex diffusion transfer process. More particularly the present invention relates to a method for the removal of the emulsion layer(s) and all other redundant layers on the aluminium support after information-wise exposure and development of the lithographic printing plate precursor.

2. Background of the Invention

The principles of the silver complex diffusion transfer reversal process, hereinafter called DTR-process, have been described e.g. in U.S. Pat. No. 2,352,014 and in the book "Photographic Silver Halide Diffusion Processes" by André Rott and Edith Weyde-The Focal Press-London and New York, (1972).

In the DTR-process non-developed silver halide of an information-wise exposed photographic silver halide emulsion layer material is transformed with a so-called silver halide solvent into soluble silver complex compounds which are allowed to diffuse into an image-receiving element and are reduced therein with a developing agent, generally in the presence of physical development nuclei, to form a silver image having reversed image density values ("DTR-image") with respect to the black silver image obtained in the exposed areas of the photographic material.

A DTR-image bearing material can be used as a planographic printing plate wherein the DTR-silver image areas form the water-repellant ink-receptive areas on a water-receptive ink-repellant background.

The DTR-image can be formed in the image-receiving layer of a sheet or web material which is a separate element with respect to the photographic silver halide emulsion material (a so-called two-sheet DTR element) or in the image-receiving layer of a so-called single-support-element, also called mono-sheet element, which contains at least one photographic silver halide emulsion layer integral with an image-receiving layer in waterpermeable relationship therewith. It is the latter mono-sheet version which is preferred for the preparation of offset printing plates by the DTR method.

Two types of the mono-sheet DTR offset printing plate exist. According to a first type disclosed in e.g. U.S. Pat. No. 4,722,535 and GB 1,241,661 a support is provided in the order given with a silver halide emulsion layer and a layer containing physical development nuclei serving as the image-receiving layer. After information-wise exposure and development the imaged element is used as a printing plate without the removal of the useless emulsion layers.

According to a second type of mono-sheet DTR offset printing plate a support, commonly anodized aluminium, is provided in the order given with a layer of physical development nuclei and a silver halide emulsion layer. After information-wise exposure and development the imaged element is washed with water to remove the emulsion layers so that a support carrying a silver image is used as a printing plate. Such type of lithographic printing plates are disclosed in e.g. EP-A 278,766 and EP-A 410,500.

For ecological reasons and for convenience it is desirable that the rinsing water can be reused to rinse several imaged elements. However it has been noted that when an anodized aluminium foil is used as the support of the imaging element reuse of the rinsing water results in a decrease of the printing endurance with the number of imaging elements processed.

SUMMARY OF THE INVENTION

It is an object of the present invention to provide an ecological and convenient method for preparing a lithographic printing plate from an imaging element having an aluminium support.

Further objects of the present invention will become clear from the description hereinafter.

According to the present invention a method is provided for preparing a lithographic aluminium offset printing plate by the steps of:
information-wise exposure of an imaging element comprising on an aluminium support a silver halide emulsion layer,
developing said information-wise exposed imaging element in the presence of a silver halide solvent to obtain a silver image on said aluminium support and
removing the emulsion layer and any other optional layer present on top of said developed silver image to expose said developed silver image using a wash water that is bufferred in a pH-range from 4 to 8.

DETAILED DESCRIPTION OF THE INVENTION

According to a preferred method of the present invention an imaging element comprising in the order given on an aluminium support an optional layer of physical development nuclei and a silver halide emulsion layer is information-wise exposed and subsequently developed using an aqueous transfer developing solution. A silver image is thus obtained in the layer of physical development nuclei or directly on the aluminium support. Said silver image is subsequently exposed by washing off all the layers above the layer containing physical development nuclei with rinsing water bufferred in the pH-range from 4 to 8.

The inventors have found that lithographic aluminium offset printing plates can be produced with a constant quality with respect to the printing endurance when a rinsing water, used to expose the developed silver image, is used that is bufferred in a pH-range from 4 to 8 even when said rinsing water is used to process several imaging elements. In the latter case the rinsing water becomes polluted mainly by developing liquid which is carried along with the developed imaging element. When a rinsing water having a pH above 8 or below 4 is employed in this case a dramatic decrease of the printing endurance and a reduced acceptance of ink results. Preferably the rinsing water is bufferred in a pH-range from 4.5 to 7.

According to the present invention the wash water can be bufferred with known buffers e.g. a phosphate buffer, a citrate buffer etc or a mixture thereof. A citrate buffer is preferred for ecological reasons.

The temperature of the rinsing water may be varied widely but is preferably between 20° C. and 30° C.

According to the present invention the imaging element preferably also comprises an intermediate water swellable layer between the layer of physical development nuclei and any subsequent layers to facilate the removal of said layers. Examples of suitable intermediate water swellable layers are e.g. a layer comprising a non-proteinic hydrophilic film forming polymer e.g. polyvinyl alcohol as disclosed in EP-A 410,500, a layer comprising water swellable polymer beads e.g. a polymethyl methacrylate beads as disclosed in EP-A 0 483 415 or a layer comprising a mixture of polymer beads and a non-proteinic film forming polymer.

The aluminium support of the imaging element used according to the present invention can be made of pure aluminium or of an aluminium alloy, the aluminium content of which is at least 95%. A useful alloy is e.g. one comprising 99.55% by weight of Al, 0.29% of Fe, 0.10% of Si, 0.004% of Cu, 0.002% of Mn, 0.02% of Ti, and 0.03% of Zn. The thickness of the support usually ranges from about 0.13 to about 0.50 mm.

The preparation of aluminium or aluminium alloy foils for lithographic offset printing comprises the following steps: graining, anodizing, and optionally sealing of the foil.

Graining and anodization of the foil are necessary to obtain a lithographic printing plate that allows to produce high-quality prints in accordance with the present invention. Sealing is not necessary but may still improve the printing results.

Graining of the aluminium surface can be carried out mechanically or electrolytically in any known way. The roughness produced by the graining is measured as a centre line average value expressed in $\mu m$ and preferably varies from about 0.2 to about 1.5 $\mu m$.

The anodization of the aluminium foil can be performed in electrolytes such as e.g. chromic acid, oxalic acid, sodium carbonate, sodium hydroxide, and mixtures thereof. Preferably, the anodization of the aluminium is performed in dilute aqueous sulphuric acid medium until the desired thickness of the anodization layer is reached. The aluminium foil may be anodized on both sides. The thickness of the anodization layer is most accurately measured by making a micrographic cut but can be determined likewise by dissolving the anodized layer and weighing the plate before dissolution treatment and subsequent thereto. Good results are obtained with an anodization layer thickness of about 0.4 to about 2.00 $\mu m$. To promote the image sharpness and, as a consequence thereof, the sharpness of the final printed copy, the anodization layer may be coloured in the mass with an antihalation dye or pigment e.g. as described in JA-A 58-14797. The dye or pigment or a combination of dyes or pigments used for such colouring in the mass are chosen such that they prevent or reduce halation in silver halide emulsions having any desired photosensitivity range comprised between 300 and 900 nm.

After the anodizing step the anodic surface may be sealed. Sealing of the pores of the aluminium oxide layer formed by anodization is a technique known to those skilled in the art of aluminium anodization. This technique has been described in e.g. the "Belgisch-Nederlands tijdschrift voor Oppervlaktetechnieken van materialen", 24ste jaargang/januari 1980, under the title "Sealing-kwaliteit en sealing-controle van geanodiseerd Aluminium". Different types of sealing of the porous anodized aluminium surface exist. An advantageous sealing method is the hydration-sealing method, according to which the pores are closed or partially closed through water-acceptance so that hydrated needle-like aluminium oxide crystals (böhmite) are formed. The anodic surface of the aluminium foil can thus be rinsed with water at 70°-100° C. or with steam. The hot sealing water may comprise additives such as nickel salts to improve the sealing effect. The sealing can also be performed by treatment of the anodic surface with an aqueous solution comprising phosphate ions or silicates. Thanks to the sealing treatment the anodic layer is rendered substantially non-porous so that longer press runs can be made with the printing plate obtained. As a result of the sealing the occurence of fog in the non-printing areas of the printing plate is avoided substantially.

The graining, anodizing, and sealing of the aluminium foil can be performed as described in e.g. U.S. Pat. No. 3,861,917 and in the documents referred to therein.

To promote the image sharpness and, as a consequence thereof, the sharpness of the final printed copy, the grained, anodized, and optionally sealed aluminium foil can be provided with a very thin antihalation coating of a dye or pigment. As already mentioned before, the usual dyes and pigments can be chosen such that they prevent or reduce halation in the silver halide emulsions used, which have any desired photosensitivity range comprised between 300 and 900 nm.

According to one embodiment the aluminium foil constitutes the sole receptor material for the silver image in that the aluminium itself takes part actively in the formation of the silver image by electrochemically reducing the transferred silver complexes. The use of such an aluminium foil as sole receptor material has been described in i.a. EP-A 0059008.

According to a frequently used alternative embodiment the grained, anodized, and optionally sealed aluminium foil can be provided with a silver-receptive stratum comprising development nuclei that initiate the physical development of the transferred silver complexes to form a silver image therein. Suitable development nuclei are sulphides of heavy metals e.g. sulphides of antimony, bismuth, cadmium, cobalt, lead, nickel, palladium, platinum, silver, and zinc. Especially suitable development nuclei are NiS.Ag$_2$S nuclei as described in U.S. Pat. No. 4,563,410. Other suitable development nuclei are salts such as e.g. selenides, polyselenides, polysulphides, mercaptans, and tin (II) halides. Heavy metals or salts thereof and fogged silver halide are suitable as well. The complex salts of lead and zinc sulphides are active both alone and when mixed with thioacetamide, dithiobiuret, and dithiooxamide. Heavy metals, preferably silver, gold, platinum, palladium, and mercury can be used in colloidal form.

The silver-receptive stratum may incorporate at least one antihalation dye or pigment to promote the image sharpness. Again, the usual dyes and pigments can be chosen depending upon the desired absorption spectrum of the silver-receptive stratum relative to the spectral sensitivity of the silver halide emulsion layer(s) used.

The silver halide emulsion layer can be any photosensitive silver halide emulsion comprising a hydrophilic colloid binder. The photosensitive silver halide used in the present invention may comprise silver chloride, silver bromide, silver bromoiodide, silver chlorobromoiodide and the like, or mixtures thereof. To obtain a sufficiently high rate of dissolution of the silver halide and a satisfactory gradation necessary for graphic purposes a silver halide emulsion mainly comprising silver chloride is often used. This silver chloride emulsion may comprise minor amounts of silver bromide and/or silver iodide.

The silver halide emulsions may be coarse- or fine-grained and can be prepared by any of the well known procedures e.g. single jet emulsions, double jet emulsions such as Lippmann emulsions, ammoniacal emulsions, thiocyanate- or thioether-ripened emulsions such as those described in U.S. Pat. Nos. 2,222,264, 3,320,069, and 3,271,157. Surface image emulsions may be used or internal image emulsions may be used as those described in U.S. Pat. Nos. 2,592,250, 3,206,313, and 3,447,927. If desired, mixtures of surface and internal image emulsions may be used as described in U.S. Pat. No. 2,996,382. The silver halide particles of the photographic emulsions may have a regular crystalline form such as a cubic or octahedral form or they may have a transition form. Regular-grain emulsions are described in e.g. J. Photogr. Sci., Vol. 12, No. 5, Sept-/Oct. 1964, pp. 242–251. The silver halide grains may also have an almost spherical form or they may have a tabular form (so-called T-grains), or may have composite crystal forms comprising a mixture of regular and irregular crystalline forms. The silver halide grains may have a multilayered structure having a core and shell of different halide composition. Besides having a differently composed core and shell the silver halide grains may comprise also different halide compositions and metal dopants inbetween.

The emulsions can be chemically sensitized e.g. by adding sulphur-containing compounds during the chemical ripening stage e.g. allyl isothiocyanate, allyl thiourea, and sodium thiosulphate. Also reducing agents e.g. the tin compounds described in BE-A 493,464 and 568,687, and polyamines such as diethylene triamine or derivatives of aminoethane-sulphonic acid can be used as chemical sensitizers. Other suitable chemical sensitizers are noble metals and noble metal compounds such as gold, platinum, palladium, iridium, ruthenium and rhodium. This method of chemical sensitization has been described in the article of R. Koslowsky, Z. Wiss. Photogr. Photophys. Photochem. 46, 65–72 (1951).

The emulsions can also be sensitized with polyalkylene oxide derivatives, e.g. with polyethylene oxide having a molecular weight of 1000 to 20,000, or with condensation products of alkylene oxides and aliphatic alcohols, glycols, cyclic dehydration products of hexitols, alkyl-substituted phenols, aliphatic carboxylic acids, aliphatic amines, aliphatic diamines and amides. The condensation products have a molecular weight of at least 700, preferably of more than 1250. It is also possible to combine these sensitizers with each other as described in BE-A 537,278 and GB-A 727,982.

Besides the silver halide another essential component of a photosensitive emulsion layer is the binder. The binder is a hydrophilic colloid, usually a protein, preferably gelatin. Gelatin can, however, be replaced in part or integrally by synthetic, semi-synthetic, or natural polymers. Synthetic substitutes for gelatin are e.g. polyvinyl alcohol, poly-N-vinyl pyrrolidone, polyvinyl imidazole, polyvinyl pyrazole, polyacrylamide, polyacrylic acid, and derivatives thereof, in particular copolymers thereof. Natural substitutes for gelatin are e.g. other proteins such as zein, albumin and casein, cellulose, saccharides, starch, and alginates. In general, the semi-synthetic substitutes for gelatin are modified natural products e.g. gelatin derivatives obtained by conversion of gelatin with alkylating or acylating agents or by grafting of polymerizable monomers on gelatin, and cellulose derivatives such as hydroxyalkyl cellulose, carboxymethyl cellulose, phthaloyl cellulose, and cellulose sulphates.

Apart from negative-working silver halide emulsions that are preferred for their high photosensitivity, use can be made also of direct-positive silver halide emulsions that produce a positive silver image in the emulsion layer(s) and a negative image on the aluminium foil.

Suitable direct positive silver halide emulsions for use in accordance with the present invention are silver halide emulsions that have been previously fogged or that mainly form an internal latent image as referred to hereinbefore.

Internal latent image-type silver halide emulsions that can be used in accordance with the present invention have been described in e.g. U.S. Pat. Nos. 2,592,250, 3,206,313, 3,271,157, 3,447,927, 3,511,662, 3,737,313, 3,761,276, GB-A 1,027,146, and JA Patent Publication No. 34,213/77. However, the silver halide emulsions used in the present invention are not limited to the silver halide emulsions described in these documents.

The other type of direct positive type silver halide emulsions for use in accordance with the present invention, which is of the previously fogged type, may be prepared by overall exposing a silver halide emulsion to light and/or by chemically fogging a silver halide emulsion. Chemical fog specks may be formed by various methods for chemical sensitization.

Chemical fogging may be carried out by reduction or by a compound which is more electropositive than silver e.g. gold salts, platinum salts, iridium salts etc., or a combination of both. Reduction fogging of the silver halide grains may occur by high pH and/or low pAg silver halide precipitation or digestion conditions e.g. as described by Wood J. Phot. Sci. 1 (1953), 163 or by treatment with reducing agents e.g. tin(II) salts which include tin(II)chloride, tin complexes and tin chelates of (poly)amino(poly)carboxilic acid type as described in British Patent 1,209,050, formaldehyde, hydrazine, hydroxylamine, sulphur compounds e.g. thiourea dioxide, phosphonium salts e.g. tetra(hydroxymethyl)-phosphonium chloride, polyamines e.g. diethylenetriamine, bis(p-aminoethyl)sulphide and its water-soluble salts, hydrazine derivatives, alkali arsenite, amine borane etc. or mixtures thereof.

When fogging of the silver halide grains occurs by means of a reducing agent e.g. thiourea dioxide and a compound of a metal more electropositive than silver especially a gold compound, the reducing agent is preferably used initially and the gold compound subsequently. However, the reverse order can be used or both compounds can be used simultaneously.

In addition to the above described methods of chemically fogging chemical fogging can be attained by using said fogging agents in combination with a sulphur-containing sensitizer, e.g. sodium thiosulphate or a thiocyanic acid compound e.g. potassium thiocyanate.

The spectral photosensitivity of the silver halide can be adjusted by proper sensitization to any desired spectral range comprised between 300 and 900 nm by means of the usual mono- or polymethine dyes such as acidic or basic cyanines, hemicyanines, oxonols, hemioxonols, styryl dyes or others, also tri- or polynuclear methine dyes e.g. rhodacyanines or neocyanines. Such spectral sensitizers have been described by e.g. F. M. Hamer in "The Cyanine Dyes and Related Compounds" (1964) Interscience Publishers, John Wiley & Sons, New York. The spectral photosensitivity of the silver halide can also be adjusted for exposure by laser light e.g. helium-neon laser light, argon laser light, and solid state laser light. Dyes that can be used for adjusting the photosensitivity to laser light have been described in i.a. JA-A 62284344, 62284345, 62141561, 62103649, 62139555, 62105147, 62105148, 62075638, 62062353, 62062354, 62062355, 62157027, 62157028, 62113148, 61203446, 62003250, 60061752, 55070834, 51115821, 51115822, 51106422, 51106423, 51106425; DE-A 3,826,700; U.S. Pat. Nos. 4,501,811, 4,725,532, 4,784,933; GB-A 1,467,638; and EP-A 100,654 and in documents cited therein.

The silver halide emulsions may comprise other ingredients e.g. antifogging agents, developers and/or development accelerators, wetting agents, and hardeners. Optionally, the silver halide emulsions may comprise matting agents or spacing agents e.g. finely divided silica particles and polymer beads as described U.S. Pat. No. 4,614,708, to promote an effective vacuum suction of the photosensitive material in vacuum contact exposure units.

As an interesting variant the silver halide emulsion may consist of a first photosensitive silver halide emulsion in which a normal latent image is formed upon image-wise exposure and a second low-speed silver halide emulsion whose speed is so low that no or almost no latent image is formed therein. When the low-speed silver halide emulsion and the photosensitive silver halide emulsion are coated to form different layers, the resulting emulsion layers are arranged in such a way that the low-speed emulsion is remotest from the aluminium foil. It is also possible to coat one single layer comprising a mixture of said photosensitive silver halide emulsion and said low-speed silver halide emulsion. Further details about silver halide emulsion layers suitable for use in accordance with the present invention can be found in e.g. EP-A-410500 and EP-A-91200133.6.

The imaging element used in accordance with the present invention is exposed in an apparatus according to its particular application, e.g. a conventional process camera containing a conventional light source or a laser containing device. Examples of HeNe laser containing exposure units are the image-setters LINOTRONIC 300, marketed by LINOTYPE Co, and CG 9600, marketed by AGFA COMPUGRAPHIC, a division of AGFA CORPORATION. An image-setter provided with an Ar ion laser is LS 210, marketed by Dr-Ing RUDOLF HELL GmbH. Exposure units provided with a laserdiode are LINOTRONIC 200, marketed by LINOTYPE Co. and CG 9400, marketed by AGFA COMPUGRAPHIC, a division of AGFA CORPORATION.

The development and diffusion transfer of the information-wise exposed imaging element are effected with the aid of an aqueous alkaline solution in the presence of at least one developing agent and at least one silver halide solvent. The developing agent(s) and/or the silver halide solvent(s) can be incorporated in the aqueous alkaline solution and/or in the imaging element itself e.g. in at least one silver halide emulsion layer and/or in a water-swellable layer or in a supplemental hydrophilic colloid layer in water-permeable relationship with the silver halide emulsion layer(s).

The silver halide solvent can also be incorporated at least in part in the silver-receptive stratum coated on the aluminium foil. When the aqueous alkaline solution does not comprise the developing agent(s), it is merely an activating liquid that is capable of dissolving the developing agent(s) contained in one of the layers.

The conventional developing agents for DTR-processing are a hydroquinone-type compound in combination with a secondary developing agent of the class of 1-phenyl-3-pyrazolidinone compounds and p-N-methyl-aminophenol. Particularly useful 1-phenyl-3-pyrazolidinone developing agents are 1-phenyl-3-pyrazolidinone, 1-phenyl-4-methyl-3-pyrazolidinone, 1-phenyl-4-ethyl-5-methyl-3-pyrazolidinone, and 1-phenyl-4,4-dimethyl-3-pyrazolidinone.

The hydroquinone-type compound is e.g. hydroquinone, methyl-hydroquinone, or chlorohydroquinone.

The silver halide solvent, which acts as a complexing agent for silver halide, preferably is a water-soluble thiosulphate or thiocyanate e.g. sodium, potassium, or ammonium thiosulphate and sodium, potassium, or ammonium thiocyanate.

Other suitable silver halide solvents are i.a. sulphites, amines, and such alkanolamines like e.g. ethanolamine, diethanolamine, triethanolamine, diisopropanolamine, 2-methyl-aminoethanol, 2ethyl-aminoethanol, 2-dimethylaminoethanol, 2-diethyl-aminoethanol, 2-methyl-2-amino-1-propanol, 1-diethylamino-2-propanol, 3-diethylamino-1-propanol, isopropylaminoethanol, 3-amino-1-propanol, 2-methyl-2-amino-1,3-propanediol, benzyldiethanolamine, and 2-(hydroxymethyl)-2-amino-1,3-propanediol.

Further suitable silver halide solvents are those disclosed in "The Theory of the Photographic Process" 4th Ed., edited by T. H. James, pages 474–475. Further interesting silver halide solvents have been described in i.a. U.S. Pat. Nos. 2,857,276, 4,355,090, 4,297,429 and 4,297,430. Among these are cyclic imide compounds such as e.g. uracil and 5,5-dialkylhydantoins. Other suitable silver halide solvents are the alkyl sulfones.

Combinations of different silver halide solvents can be used and it is even possible to incorporate at least one silver halide solvent into a suitable layer and add at least one other silver halide solvent to the developing solution.

The following quantitative ranges given for the developing agents, silver halide solvents, and sulphite apply to the amount of these compounds present as solutes in the aqueous alkaline solution during the DTR-processing, whether these compounds make part of the aqueous alkaline solution, which in that particular case actually is an aqueous alkaline developing solution, or were dissolved from the layers containing them upon application thereto of the aqueous alkaline solution, in which case it is an activating solution.

A suitable quantitative combination of hydroquinone and at least one secondary developing agent of the class of 1-phenyl-3-pyrazolidinones and p-N-methyl-aminophenol comprises hydroquinone in an amount not lower than 0.078 mole per liter of aqueous alkaline solution and the secondary developing agent(s) in an amount not lower than 0.0080 mole per liter, the molar ratio of hydroquinone to said secondary developing agent(s) not being lower than 9.7. Preferred amounts of hydroquinone are in the range of 0.05 mole to 0.25 mole per liter and preferred amounts of secondary developing agent(s) in the range of $1.8 \times 10^{-3}$ to $2.0 \times 10^{-2}$ mole per liter.

The aqueous alkaline solution may comprise sulphite e.g. sodium sulphite in an amount ranging from 40 g to 180 g per liter, preferably from 60 to 160 g per liter, and thiosulphate and/or thiocyanate in an amount ranging from 5 g to 20 g per liter.

The pH of the aqueous alkaline solution preferably is at least 12, but depends on the type of silver halide emulsion material to be developed, intended development time, and processing temperature.

The processing conditions such as temperature and time may vary within broad ranges provided the mechanical strength of the materials to be processed is not adversely influenced and no decomposition takes place.

The aqueous alkaline solution may comprise such alkali-providing substances like hydroxides of sodium and potassium, alkali metal salts of phosphoric acid and/or silicic acid e.g. trisodium phosphate, orthosilicates, metasilicates, hydrodisilicates of sodium or potassium, and sodium carbonate. The alkali-providing substances can be substituted in part or wholly by alkanolamines.

The aqueous alkaline solution may comprise at least one alkanolamine to improve its life-time and performance for the DTR-process. Suitable alkanolamines are i.a. N,N,N-triethanolamine, 2-amino-2-hydroxymethyl-propan-1,3-diol, N-methyl-diethanolamine, N-ethyl-diethanolamine, diisopropanolamine, N,N-diethanolamine, 3,3'-amino-dipropanol, 2-amino-2-methyl-propan-1,3-diol, N-propyl-diethanolamine, N-butyl-diethanolamine, N,N-dimethyl-ethanolamine, N,N-diethyl-ethanolamine, N,N-diethyl-isopropanolamine, 1-amino-propan-2-ol, N-ethanolamine, N-methyl-ethanolamine, N-ethyl-ethanolamine, 3-amino-propanol, 4-amino-butanol, and 5-amino-pentan-1-ol.

According to a preferred embodiment described in Research Disclosure 27939 (July 1987) pages 450–451 the aqueous alkaline solution comprises at least one tertiary alkanolamine having a pKa value higher than 8.5. More preferably, the solution comprises two or more tertiary alkanolamines having a pKa value higher than 9.0.

The aqueous alkaline solution may further comprise silver-image hydrophobizing compounds e.g. heterocyclic mercapto compounds. The addition of heterocyclic mercapto compounds more particularly a mercapto-1,3,4-thiadiazole to a developing liquid for the purpose of hydrophobizing the silver image formed according to the DTR-process on an aluminium foil has been described already in DE-A 1,228,927. Other suitable mercapto-thiadiazoles that can be added to the aqueous alkaline solution have been disclosed in U.S. Pat. No. 4,563,410. Another suitable hydrophobizing compound is 2-mercapto-5-heptyl-oxa-3,4-diazole.

These hydrophobizing compounds can be added to the aqueous alkaline solution in an amount of preferably 0.1 to 3 g per liter and preferably in admixture with 1-phenyl-5-mercaptotetrazole, the latter compound being used in amounts of e.g. 50 mg to 1.2 g per liter of solution, which may contain a minor amount of ethanol to improve the dissolution of said compounds.

The aqueous alkaline solution may comprise other ingredients such as e.g. oxidation preservatives, a compound releasing bromide ions, calcium-sequestering compounds, anti-sludge agents, and hardeners including latent hardeners.

Regeneration of the aqueous alkaline solution according to known methods is, of course, possible, whether the solution incorporates developing agent(s) and/or silver halide solvent(s) or not.

The development may be stopped—though this is often not necessary—with a so-called stabilization liquid, which actually is an acidic stop-bath having a pH preferably in the range of 5 to 6.

Bufferred stop bath compositions comprising a mixture of sodium dihydrogen orthophosphate and disodium hydrogen orthophosphate and having a pH in said range are preferred.

The developement and diffusion transfer can be initiated in different ways e.g. by rubbing with a roller, by wiping with an absorbent means- e.g. with a plug of cotton or sponge, or by dipping the material to be treated in the liquid composition. Preferably, they proceed in an automatically operated apparatus such as the CR 430, CR 740, or CR 1100-Processors marketed by AGFA-GEVAERT, Belgium. They are normally carried out at a temperature in the range of 18° C. to 30° C.

After formation of the silver image on the aluminium foil the excess of alkaline solution still present on the foil is eliminated, preferably by guiding the foil through a pair of squeezing rollers.

The following example illustrates the present invention without however, limiting it thereto. All parts, percentages and ratios are by weight unless otherwise indicated.

EXAMPLE 1

4 equal imaging elements were made according to the invention sample of example 1 described in EP-A-0 483 415.

The imaging elements were identically exposed through a contact screen in a process-camera and immersed for 8 s at 25° C. in a freshly made developing solution having the following ingredients in a CR 430 processor marketed by AGFA-GEVAERT, Belgium:

| | |
|---|---|
| carboxymethylcellulose | 18 g |
| sodium hydroxide | 22.5 g |
| anhydrous sodium sulphite | 120 g |
| hydroquinone | 20 g |
| 1-phenyl-3-pyrazolidinone | 3 g |
| potassium bromide | 0.75 g |
| anhydrous sodium thiosulphate | 7.5 g |
| ethylene diamine tetraacetic acid tetrasodium salt | 3.2 g |
| demineralized water to make | 1000 ml |
| pH (25° C.) = 13 | |

The initiated diffusion transfer was allowed to continue for 30 s to form a silver image on the aluminium foil.

Each of the 4 developed monosheet layer assemblages was then rinsed for 1 min. with a water jet to remove all the layers above the silver image so as to expose it.

The rinsing water for each of the imaging elements differed according to table 1.

TABLE 1

| Sample no. | composition of rinsing water |
|---|---|
| 1 | plain water |
| 2 | 900 ml of plain water + 100 ml of developing liquid |
| 3 | aqueous solution of 20 g/l of $NaH_2PO_4.2H_2O$ and 4.5 g/l of $Na_2HPO_4.12H_2O$ pH = 5.7 |
| 4 | 900 ml of rinsing water of sample 3 + 100 ml of developing liquid pH = 6.9 |

The developing liquid added had the composition shown above. The addition of 100 ml of this developing liquid is equivalent to the pollution of plain rinsing water when it has been used to process 5 $m^2$ of imaging element.

Next, the imaged surface of the aluminium foil was rubbed with a fixer having the composition show below to enhance the water-receptivity of the non-image areas and to make the image areas oleophilic ink-receptive. The fixer had the following composition:

| | |
|---|---|
| 10% aqueous n-hexadecyl trimethyl ammonium chloride | 25 ml |
| 20% aqueous solution of polystyrene sulphonic acid | 100 ml |
| potassium nitrate | 12.5 g |
| citric acid | 20.0 g |
| 1-phenyl-5-mercaptotetrazole | 2.0 g |
| sodium hydroxide | 5.5 g |
| water to make | 1000 ml |
| pH (20° C.) = 4 | |

Each of the printing plates obtained was placed on an Heidelberg offset printing press, type GTO, marketed by HEIDELBERGER DRUCKMASCHINEN AG, D-6900 Heidelberg, West-Germany.

Each printing plate was inked with a commercially available KAST+EHINGER 123W ink and then used for printing copy sheets of paper. The results for each of the samples are shown in table 2.

TABLE 2

| Sample no. | ink acceptance | printing endurance |
|---|---|---|
| 1 | excellent | >100000 |
| 2 | very bad | <100 |
| 3 | excellent | >100000 |
| 4 | excellent | >100000 |

From table 2 it can be seen that when the rinsing water is buffered at a pH between 4 and 8 good printing properties are obtained even if the rinsing water becomes polluted with developing liquid.

We claim:

1. A method for making a lithographic aluminium offset printing plate comprising the steps of:
   information-wise exposing an imaging element comprising on an aluminium support a silver halide emulsion layer
   developing said information-wise exposed imaging element in the presence of a silver halide solvent to obtain a silver image on said aluminium support and
   removing said silver halide emulsion layer and any optional layer on top of said silver image to expose said silver image by means of washing with rinsing water characterized in that said rinsing water has a pH between 4 and 8 and is buffered.

2. A method according to claim 1 wherein said rinsing water is buffered with a citrate buffer, a phosphate buffer or a mixture thereof.

3. A method according to claim 1 or 2 wherein the pH of said rinsing water is between 4.5 and 7.

4. A method according to claim 1 wherein a layer of physical development nuclei is provided directly on said aluminium support.

5. A method according to claim 4 wherein said imaging element comprises an intermediate water swellable layer between said layer of physical development nuclei and any subsequent layers.

6. A method according to claim 5 wherein said intermediate water swellable layer comprises a non-proteinic hydrophilic film forming polymer, water swellable polymer beads or a mixture thereof.

7. A method according to claim 6 wherein said non-proteinic hydrophilic film forming polymer is polyvinyl alcohol.

8. A method according to claim 6 wherein said water swellable polymer beads are polymethylmethacrylate beads.

* * * * *